(12) United States Patent
Mathew et al.

(10) Patent No.: US 10,361,204 B2
(45) Date of Patent: Jul. 23, 2019

(54) MEMORY CELLS AND MEMORY ARRAYS

(71) Applicant: Micron Technology, Inc., Boise, ID (US)

(72) Inventors: Suraj J. Mathew, Boise, ID (US); Raghunath Singanamalla, Boise, ID (US); Fawad Ahmed, Boise, ID (US); Kris K. Brown, Garden City, ID (US); Vinay Nair, Boise, ID (US); Gloria Yang, Boise, ID (US); Fatma Arzum Slmsek-Ege, Boise, ID (US); Diem Thy N. Tran, Garden City, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/006,301

(22) Filed: Jun. 12, 2018

(65) Prior Publication Data

US 2018/0301454 A1   Oct. 18, 2018

Related U.S. Application Data

(63) Continuation of application No. 15/664,183, filed on Jul. 31, 2017, now Pat. No. 10,079,235.

(Continued)

(51) Int. Cl.
*H01L 27/108* (2006.01)
*G11C 5/06* (2006.01)
(Continued)

(52) U.S. Cl.
CPC ............ *H01L 27/108* (2013.01); *G11C 5/063* (2013.01); *G11C 11/405* (2013.01);
(Continued)

(58) Field of Classification Search
CPC ............ H01L 27/108; H01L 27/10841; H01L 27/10864
See application file for complete search history.

(56) References Cited

U.S. PATENT DOCUMENTS

| 4,103,342 A | 7/1978 | Miersch et al. |
| 4,554,570 A | 11/1985 | Jastrzebski |

(Continued)

FOREIGN PATENT DOCUMENTS

| JP | 2003-303901 | 10/2003 |
| JP | 2011-142256 | 7/2011 |

(Continued)

OTHER PUBLICATIONS

WO PCT/US2017/044611, Nov. 13, 2017, Search Report/Written Opinion.

(Continued)

*Primary Examiner* — Phat X Cao
(74) *Attorney, Agent, or Firm* — Wells St. John P.S.

(57) ABSTRACT

Some embodiments include a memory cell having first, second and third transistors, with the second and third transistors being vertically displaced relative to one another. The memory cell has a semiconductor pillar extending along the second and third transistors, with the semiconductor pillar containing channel regions and source/drain regions of the second and third transistors. A capacitor may be electrically coupled between a source/drain region of the first transistor and a gate of the second transistor.

3 Claims, 10 Drawing Sheets

Related U.S. Application Data (60) Provisional application No. 62/381,704, filed on Aug. 31, 2016.

(51) Int. Cl.
*G11C 11/405* (2006.01)
*G11C 11/401* (2006.01)

(52) U.S. Cl.
CPC .. *H01L 27/10841* (2013.01); *H01L 27/10864* (2013.01); *G11C 11/401* (2013.01)

(56) References Cited

U.S. PATENT DOCUMENTS

| | | |
|---|---|---|
| 5,066,607 A | 11/1991 | Banerjee |
| 5,299,155 A | 3/1994 | Yanagi |
| 5,389,810 A | 2/1995 | Agata |
| 5,571,743 A | 11/1996 | Henkels et al. |
| 5,646,900 A | 7/1997 | Tsukude et al. |
| 6,154,387 A | 11/2000 | Takata |
| 6,483,737 B2 | 11/2002 | Takeuchi et al. |
| 6,563,727 B1 | 5/2003 | Roth et al. |
| 6,720,609 B2 | 4/2004 | Deboer et al. |
| 6,744,087 B2 | 6/2004 | Misewich et al. |
| 6,961,271 B2 | 11/2005 | Jeon et al. |
| 7,330,388 B1 | 2/2008 | Chapman et al. |
| 7,378,702 B2 | 5/2008 | Lee |
| 7,408,218 B2 | 8/2008 | Akiyama et al. |
| 7,558,097 B2 | 7/2009 | Khellah et al. |
| 7,697,318 B2 | 4/2010 | Fukuda et al. |
| 8,212,311 B2 | 7/2012 | Masuoka et al. |
| 8,394,699 B2 | 3/2013 | Haller et al. |
| 8,866,208 B2 | 10/2014 | Lee |
| 9,343,507 B2 | 5/2016 | Takaki |
| 9,378,780 B1 | 6/2016 | Chang et al. |
| 10,157,926 B2 | 12/2018 | Yang et al. |
| 2001/0053088 A1 | 12/2001 | Forbes |
| 2002/0044477 A1 | 4/2002 | Takeuchi et al. |
| 2003/0087499 A1 | 5/2003 | Lane et al. |
| 2003/0169616 A1 | 9/2003 | Noro |
| 2003/0173593 A1 | 9/2003 | Miyatake |
| 2003/0202391 A1 | 10/2003 | Nishimura et al. |
| 2003/0234413 A1 | 12/2003 | Sberno et al. |
| 2004/0062101 A1 | 4/2004 | Kasuga |
| 2004/0151020 A1 | 8/2004 | Beer |
| 2004/0174733 A1 | 9/2004 | Kirihata et al. |
| 2004/0232497 A1 | 11/2004 | Akiyama |
| 2004/0252542 A1 | 12/2004 | Hoya et al. |
| 2006/0028859 A1* | 2/2006 | Forbes .................. G11C 11/405 365/149 |
| 2006/0046424 A1 | 3/2006 | Chance et al. |
| 2006/0138466 A1 | 6/2006 | Choi |
| 2006/0211194 A1 | 9/2006 | Haller |
| 2007/0034928 A1 | 2/2007 | Cook et al. |
| 2007/0161179 A1 | 7/2007 | Lee |
| 2007/0295995 A1 | 12/2007 | Yun |
| 2009/0008691 A1 | 1/2009 | Lee et al. |
| 2009/0108881 A1 | 4/2009 | Wilson |
| 2009/0168489 A1 | 7/2009 | Madan et al. |
| 2009/0212338 A1 | 8/2009 | Benson |
| 2010/0165704 A1 | 7/2010 | Wu et al. |
| 2010/0238697 A1 | 9/2010 | Juengling |
| 2010/0264484 A1 | 10/2010 | Masuoka et al. |
| 2010/0295110 A1 | 11/2010 | Takaishi |
| 2012/0153371 A1 | 6/2012 | Chen et al. |
| 2013/0161607 A1 | 6/2013 | Yoneda |
| 2013/0221356 A1 | 8/2013 | Yamazaki |
| 2013/0235641 A1* | 9/2013 | Iwaki .................... G11C 5/063 365/63 |
| 2013/0235642 A1 | 9/2013 | Heineck et al. |
| 2014/0035018 A1 | 2/2014 | Lee |
| 2014/0054718 A1 | 2/2014 | Karda et al. |
| 2014/0220749 A1 | 8/2014 | Rutter |
| 2015/0041885 A1 | 2/2015 | Yoshida et al. |
| 2015/0078056 A1 | 3/2015 | Liu |
| 2015/0318285 A1 | 11/2015 | Zhang |
| 2016/0071843 A1 | 3/2016 | Kadoya |
| 2016/0079247 A1 | 3/2016 | Lim et al. |
| 2018/0061835 A1 | 3/2018 | Yang et al. |

FOREIGN PATENT DOCUMENTS

| | | |
|---|---|---|
| KR | 10-2007-0070021 | 7/2007 |
| TW | 106128404 | 8/2018 |
| TW | 107100862 | 8/2018 |

OTHER PUBLICATIONS

WO PCT/US2017/044633, Nov. 13, 2017, Search Report/Written Opinion.
WO PCT/US2017/044638, Nov. 15, 2017, Search Report/Written Opinion.
WO PCT/US2017/044653, Nov. 10, 2017, Search Report/Written Opinion.
WO PCT/US2017/044661, Nov. 8, 2017, Search Report/Written Opinion.
WO PCT/US2017/045052, Nov. 10, 2017, Search Report/Written Opinion.
WO PCT/US2017/068227, Apr. 17, 2018, Search Report/Written Opinion.
Chun et al.; "A 3T Gain Cell Embedded DRAM Utilizing Preferential Boosting for High Density and Low Power On-Die Caches"; IEEE Journal of Solid-State Circuits; vol. 46, No. 6, Jun. 2011; pp. 1495-1505.
Henkels et al., "Large-Signal 2T 1C DRAM Cell: Signal and Layout Analysis", IEEE Journal of Solid-State Circuits, vol. 29(7), Jul. 1994, pp. 829-832.
WO PCT/US2018/041312, Nov. 7, 2018, Search Report/Written Opinion.
Hewes, "Circuit Diagrams", available online at https://electronicsclub.info/circuitdiagrams.htm, Dec. 14, 2018, pp. 1-3.

* cited by examiner

MEMORY CELLS AND MEMORY ARRAYS

RELATED PATENT DATA

This patent is a continuation of U.S. patent application Ser. No. 15/664,183, which was filed Jul. 31, 2017, and which claims priority to U.S. Provisional Patent Application Ser. No. 62/381,704, which was filed Aug. 31, 2016.

TECHNICAL FIELD

Memory cells, such as memory cells having three transistors and one capacitor (i.e., 3T-1C memory cells). Memory arrays comprising 3T-1C memory cells.

BACKGROUND

Figure 1:
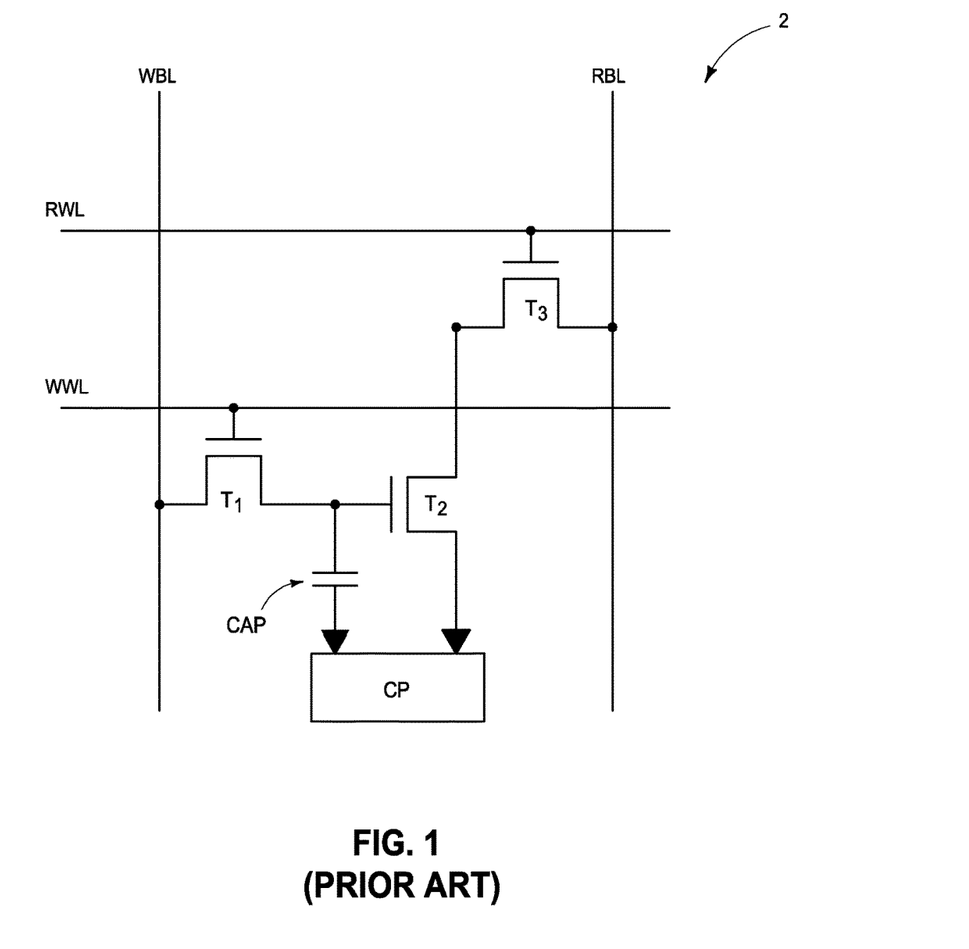
FIG. 1 is a schematic diagram of a prior art memory cell having 3 transistors and 1 capacitor.

A prior art memory cell configuration utilizes a single capacitor in combination with three transistors, and may be referred to as a 3T-1C memory cell. Such memory cell is schematically illustrated in FIG. 1 as a memory cell 2. The three transistors are labeled as T1, T2 and T3.

A source/drain region of T1 connects with a write bitline (WBL), and the other source/drain region of T1 connects with the capacitor (CAP). A gate of T1 connects with a write wordline (WWL).

A source/drain region of T2 connects with a common plate (CP), and the other source/drain region of T2 connects with a source/drain region of T3. A gate of T2 connects with the capacitor (CAP). The common plate may be coupled with any suitable voltage, such as a voltage within a range of from greater than or equal to ground to less than or equal to a power supply voltage VCC (i.e., ground≤CP≤VCC). In some applications the common plate is at a voltage of about one-half VCC (i.e., about VCC/2).

One of the source/drain regions of T3 is the source/drain region connected with the source/drain region of T2, and the other connects with a read bitline (RBL). A gate of T3 connects with a read wordline (RWL).

The 3T-1C configuration of FIG. 1 may be utilized in DRAM (dynamic random access memory). Presently, DRAM commonly utilizes memory cells having one capacitor in combination with a transistor (so-called 1T-1C memory cells), with the capacitor being coupled with a source/drain region of the transistor. A possible advantage of 3T-1C configurations as compared to 1T-1C configurations is that charge stored on the capacitor within the 3T-1C configurations is utilized to control a gate of T2 rather than being directly shared with a bitline. This may enable much lower capacitance to be utilized in the 3T-1C configurations as compared to the 1T-1C configurations. One of the limitations to scalability of present 1T-1C configurations is that it is proving difficult to incorporate capacitors having sufficiently high capacitance into highly-integrated architectures. Accordingly, utilization of 3T-1C configurations, and the associated lower capacitance needs of such configurations, may ultimately enable increased scalability as compared to the 1T-1C configurations. However, the 3T-1C configurations have more components than the 1T-1C configurations (three transistors instead of one), which may make it difficult to incorporate 3T-1C configurations into highly-integrated modern memory architecture.

It would be desirable to develop 3T-1C configurations suitable for incorporation into highly-integrated modern memory architectures.

DETAILED DESCRIPTION OF THE ILLUSTRATED EMBODIMENTS

Some embodiments include 3T-1C configurations in which two or more components are vertically stacked relative to one another in order to increase integration. Specific example embodiments of stacking arrangements are described below with reference to FIGS. 2-14.

Figure 2:
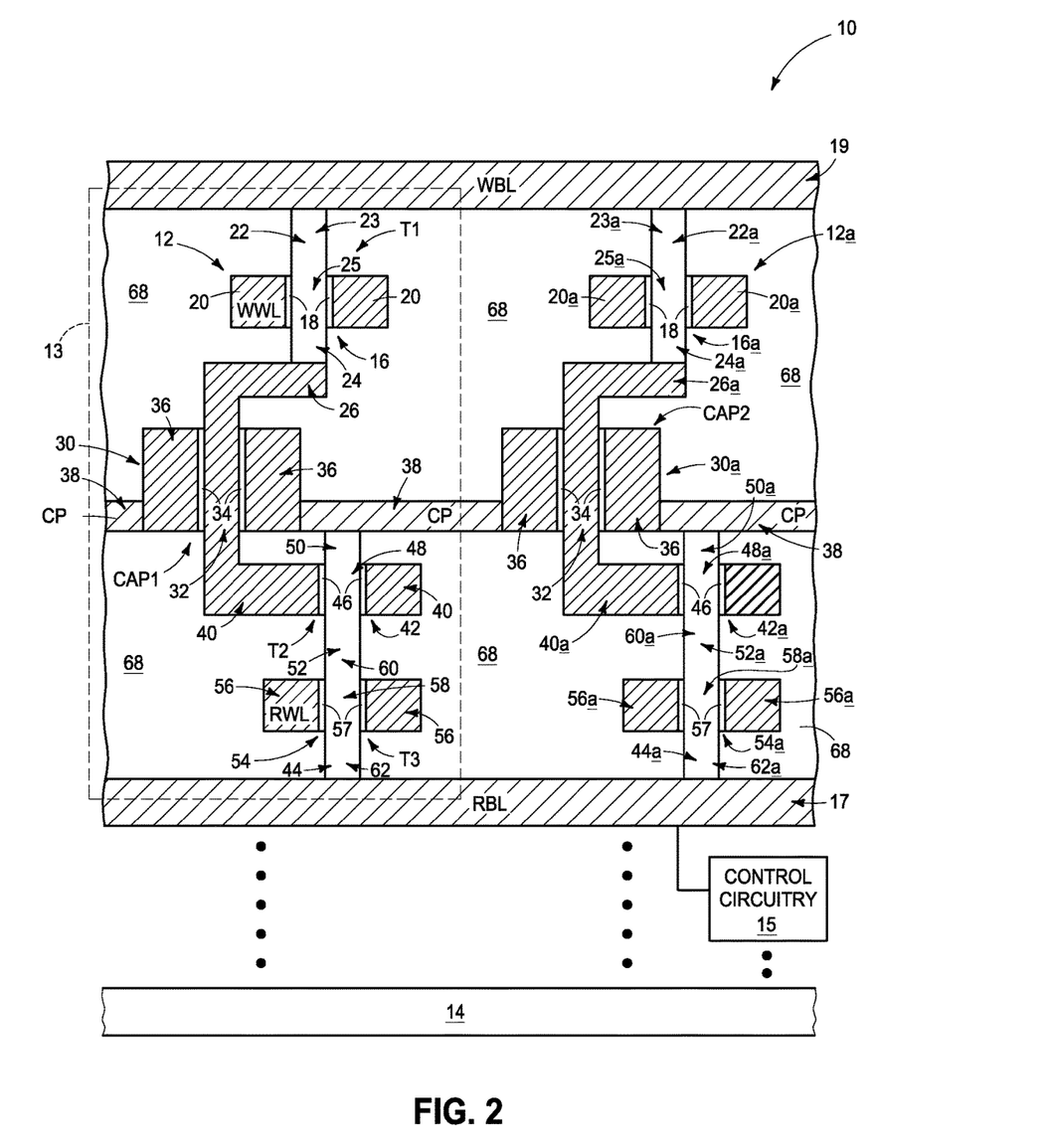
FIG. 2 is a diagrammatic cross-sectional side view of a region of a memory array showing an example configuration for memory cells having 3 transistors and 1 capacitor.

Referring to FIG. 2, a portion of a memory array 10 is illustrated. The memory array includes 3T-1C memory cells. An example memory cell 12 is within a region demarcated by a dashed line 13, and an adjacent memory cell 12a is also shown in the illustrated portion of memory array 10.

The illustrated portion of memory array 10 is supported by a base 14. The base 14 may comprise semiconductor material; and may, for example, comprise, consist essentially of, or consist of monocrystalline silicon. The base may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications the base 14 may correspond to a semiconductor substrate containing one or more materials associated with integrated circuit fabrication. Such materials may include, for example, one or more of refractory metal materials, barrier materials, diffusion materials, insulator materials, etc. The base 14 is shown to be spaced from components of array 10 to indicate that other circuitry or components may be between array 10 and the base 14. An interlayer insulating film may intervene between the base 14 and the array 10.

Control circuitry 15 is supported by base 14 and connects with a read bitline (RBL) 17. The control circuitry is utilized for accessing/sensing memory cells 12 and 12a, and may comprise any suitable circuitry, including, for example, CMOS circuitry. The control circuitry may be in any suitable location relative to RBL 17 in specific applications, including, for example, below the bitline, laterally adjacent the bitline or above the bitline. Control circuitry 15 may be further incorporated into the base 14 as a sense amplifier together with other electrical circuits that may be used to access to the memory array 10 to read or write data from or into the memory array 10. In applications where an interlayer insulating film intervenes between the memory array 10 and the base 14, a plurality of vias may be formed in the interlayer insulating film to electrically connect wordlines (WWL and RWL) and bitlines (WBL and RBL) of the memory array 10 to circuitry, such as the sense amplifiers 15 that may be formed in the base 14. In some embodiments it may be advantageous for the memory cells of array 10 to be stacked above the control circuitry to reduce an overall footprint of the memory array and its associated control circuitry.

A write bitline (WBL) 19 is over the read bitline 17, and is spaced from the read bitline.

The read bitline 17 and write bitline 19 may comprise any suitable electrically conductive compositions or combinations of electrically conductive compositions; including, for example, one or more of various metals (e.g., tungsten, titanium, etc.), metal-containing materials (for instance, metal nitride, metal silicide, metal carbide, etc.), conductively-doped semiconductor materials (for instance, conductively-doped silicon, conductively-doped germanium, etc.), etc. The read and write bitlines may comprise a same composition as one another, or may comprise different compositions relative to one another.

Memory cells 12 and 12a comprise first transistors 16 and 16a, respectively, under the write bitline 19. The first transistors correspond to T1 transistors (with the label T1 being shown relative to transistor 16 of memory cell 12). The transistors 16 and 16a include gate dielectric material 18 and conductive gate materials 20 and 20a, respectively, along the gate dielectric material. The conductive gate materials 20 and 20a are comprised by wordlines that extend in and out of the page relative to the cross-section of FIG. 2, with the wordline of memory cell 12 being labeled as WWL to identify it as a write wordline of the type described with reference to FIG. 1.

The gate dielectric material 18 may comprise any suitable composition or combination of compositions, including, for example, silicon oxide, high-K dielectric materials, etc.

The conductive gate materials 20 and 20a may comprise any suitable composition or combination of compositions, including, for example, one or more of various metals (e.g., tungsten, titanium, etc.), metal-containing materials (for instance, metal nitride, metal silicide, metal carbide, etc.), conductively-doped semiconductor materials (for instance, conductively-doped silicon, conductively-doped germanium, etc.), etc.

Semiconductor pillars 22 and 22a extend from the write bitline 17 and downwardly through first transistors 16 and 16a. Such semiconductor pillars may comprise any suitable semiconductor material, including, for example, silicon, germanium, etc.

The first transistor 16 comprises conductively-doped source/drain regions 23 and 24 within semiconductor material of pillar 22, and comprises a channel region 25 within pillar 22 and extending between the source/drain regions 23 and 24. The source/drain regions 23 and 24 may be referred to as a first source/drain region and a second source/drain region, respectively; and the channel region 25 may be referred to as a first channel region. The first transistor 16a comprises first and second source/drain regions 23a and 24a analogous to the regions 23 and 24 of transistor 16, and also comprises a first channel region 25a between the source/drain regions 23a and 24a.

The first source/drain regions 23 and 23a are electrically coupled with the write bitline 19, and in the shown embodiment extend to directly contact the write bitline.

The source/drain regions 24 and 24a extend to conductive interconnects 26 and 26a, and such conductive interconnects extend to capacitors 30 and 30a, respectively. The capacitors may be alternatively referred to as CAP1 and CAP2.

Each of the capacitors has an inner node (or first node) 32, a capacitor dielectric material 34, and an outer node (or second node) 36. The inner and outer nodes 32 and 36 may comprise any suitable electrically conductive compositions or combinations of electrically conductive compositions; including, for example, one or more of various metals (e.g., tungsten, titanium, etc.), metal-containing materials (for instance, metal nitride, metal silicide, metal carbide, etc.), conductively-doped semiconductor materials (for instance, conductively-doped silicon, conductively-doped germanium, etc.), etc. The inner and outer nodes 32 and 36 may comprise the same composition as one another in some embodiments, and in other embodiments may comprise different compositions relative to one another.

The capacitor dielectric material 34 may comprise any suitable composition or combination of compositions. In some embodiments, the capacitor dielectric material may comprise non-ferroelectric material and may, for example, consist of one or more of silicon dioxide, silicon nitride, aluminum oxide, hafnium oxide, zirconium oxide, etc. In some embodiments, the capacitor dielectric material may comprise ferroelectric material. For instance, the capacitor dielectric material may comprise, consist essentially of, or consist of one or more materials selected from the group consisting of transition metal oxide, zirconium, zirconium oxide, hafnium, hafnium oxide, lead zirconium titanate, tantalum oxide, and barium strontium titanate; and having dopant therein which comprises one or more of silicon, aluminum, lanthanum, yttrium, erbium, calcium, magnesium, niobium, strontium, and a rare earth element.

In the illustrated embodiment the outer nodes 36 are directly against contacts 38 that are electrically coupled with a common plate (CP). The contacts 38 may comprise any suitable electrically conductive materials.

The inner nodes 32 are electrically coupled with the second source/drain regions 24 and 24a of the first transistors 16 and 16a through interconnects 26 and 26a.

The inner nodes 32 extend to gates 40 and 40a of transistors 42 and 42a. Such transistors correspond to second transistors (T2) of memory cells 12 and 12a, with the label T2 being shown relative to the transistor 42 of memory cell 12.

The interconnects (26 and 26a), inner nodes 32, and gates (40 and 40a) may comprise any suitable electrically conductive compositions or combinations of electrically conductive compositions; including, for example, one or more of various metals (e.g., tungsten, titanium, etc.), metal-containing materials (for instance, metal nitride, metal silicide, metal carbide, etc.), conductively-doped semiconductor materials (for instance, conductively-doped silicon, conductively-doped germanium, etc.), etc. In the shown embodiment the interconnects (26 and 26a), inner nodes 32, and gates (40 and 40a) comprise a single homogeneous electrically conductive material. In other embodiments, two or more different electrically conductive materials may be utilized in place of the single homogeneous material.

Semiconductor pillars 44 and 44a extend through the gates 40 and 40a, with semiconductor material of pillars 44 and 44a being spaced from conductive material of gates 40 and 40a by gate dielectric material 46. The gate dielectric material may comprise any suitable composition or combination of compositions; and may, for example, comprise one or more of, silicon oxide, high-K dielectric materials, etc. The semiconductor pillars 44 and 44*a* may comprise any suitable semiconductor materials or combinations of semiconductor materials; such as, for example, silicon, germanium, etc.

The transistors 42 and 42*a* comprise channel regions 48 and 48*a* within semiconductor material of pillars 44 and 44*a*. Transistor 42 comprises source/drain regions 50 and 52 on opposing sides of channel region 48 and electrically coupled with one another through the channel region. Similarly, transistor 42*a* comprises source/drain regions 50*a* and 52*a* on opposing sides of channel region 48*a*. The channel regions 48 and 48*a* of the second transistors 42 and 42*a* may be referred to as second channel regions distinguish them from the first channel regions (25 and 25*a*) of the first transistors (16 and 16*a*). The source/drain regions 50 and 52 may be referred to as third and fourth source/drain regions, respectively. to distinguish them from the first and second source/drain regions 23 and 24 of the first transistor 25; and similarly the source/drain regions 50*a* and 52*a* may be referred to as third and fourth source/drain regions. The semiconductor pillars 44 and 22 may be vertically aligned with each other. Similarly, the semiconductor pillars 44*a* and 22*a* may be vertically aligned with each other.

The semiconductor pillars 44 and 44*a* extend downwardly from the second transistors 42 and 42*a*, and extend through third transistors 54 and 54*a*; with such third transistors corresponding to the transistor T3 of the 3T-1C memory cells (the label T3 is provided relative to the transistor 54 of memory cell 12).

The third transistors 54 and 54*a* have gates 56 and 56*a* connected to read wordlines (RWL), with a label "RWL" specifically being provided relative to the gate 54 of memory cell 12. The gates 54 and 54*a* may comprise any suitable electrically conductive material, such as, for example, one or more of the materials described previously with reference to the gates 42 and 42*a* of the second transistors T2.

Semiconductor material of pillars 44 and 44*a* is spaced from conductive material of gates 56 and 56*a* by gate dielectric material 57. Such gate dielectric material may comprise any suitable composition or combination of compositions; and may, for example, comprise one or more of, silicon oxide, high-K dielectric materials, etc.

The third transistors 54 and 54*a* have channel regions 58 and 58*a* within the semiconductive material of pillars 44 and 44*a*. Transistor 54 comprises source/drain regions 60 and 62 on opposing sides of channel region 58 and electrically coupled with one another through the channel region. Similarly, transistor 54*a* comprises source/drain regions 60*a* and 62*a* on opposing sides of channel region 58*a*. The channel regions 58 and 58*a* may be referred to as third channel regions. The source/drain regions 60 and 62 may be referred to as fifth and sixth source/drain regions, respectively; and similarly the source/drain regions 60*a* and 62*a* may be referred to as fifth and sixth source/drain regions.

In the shown embodiment, the fifth source/drain regions 60 and 60*a* of transistors T3 overlap the fourth source/drain regions 52 and 52*a* of transistors T2 within semiconductor pillars 44 and 44*a*; and in practice the fourth source/drain regions may be effectively identical and coextensive with the fifth source/drain regions. In other embodiments, the fifth source/drain regions may be separated from the fourth source/drain regions and electrically coupled to the fourth source/drain regions through interconnects (not shown).

In the illustrated embodiment, the semiconductor pillars 44 and 44*a* extend from the read bitline 17 to the contact 38. The third transistors 54 and 54*a* (i.e., the T3 transistors) are vertically stacked under the second transistors 42 and 42*a* (i.e., the T2 transistors); common plate contacts 38 are vertically over the second transistors 42 and 42*a*, and coupled with source/drain regions (50/50*a*) of the second transistors; and a read bitline 17 is under the third transistors 54 and 54*a*, and is electrically coupled with source/drain regions (62/62*a*) of the third transistors.

Insulative material 68 is shown to surround the various components of memory cells 12 and 12*a*. Such insulative material may comprise any suitable composition or combination of compositions; including, for example, one or more of silicon dioxide, silicon nitride, borophosphosilicate glass, spin-on dielectric, etc. Although insulative material 68 is shown as a single homogeneous material, in other embodiments the insulative material may include two or more discrete insulative compositions.

The source/drain regions of the first, second and third transistors (16/16*a*/42/42*a*/54/54*a*) may be doped with any suitable dopant(s) to any suitable concentration(s); and may be majority n-type doped in some applications, and majority p-type doped in other applications.

Figure 3:
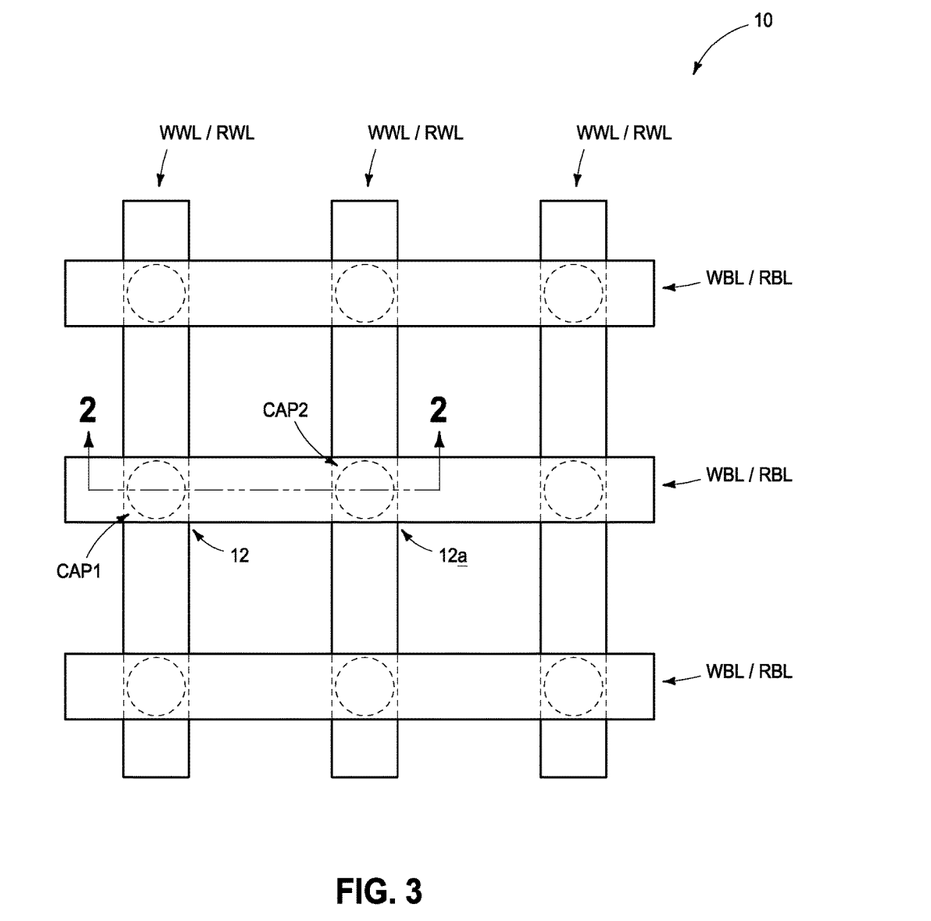
FIG. 3 is a diagrammatic top view of the memory array of FIG. 2.
Figure 4:
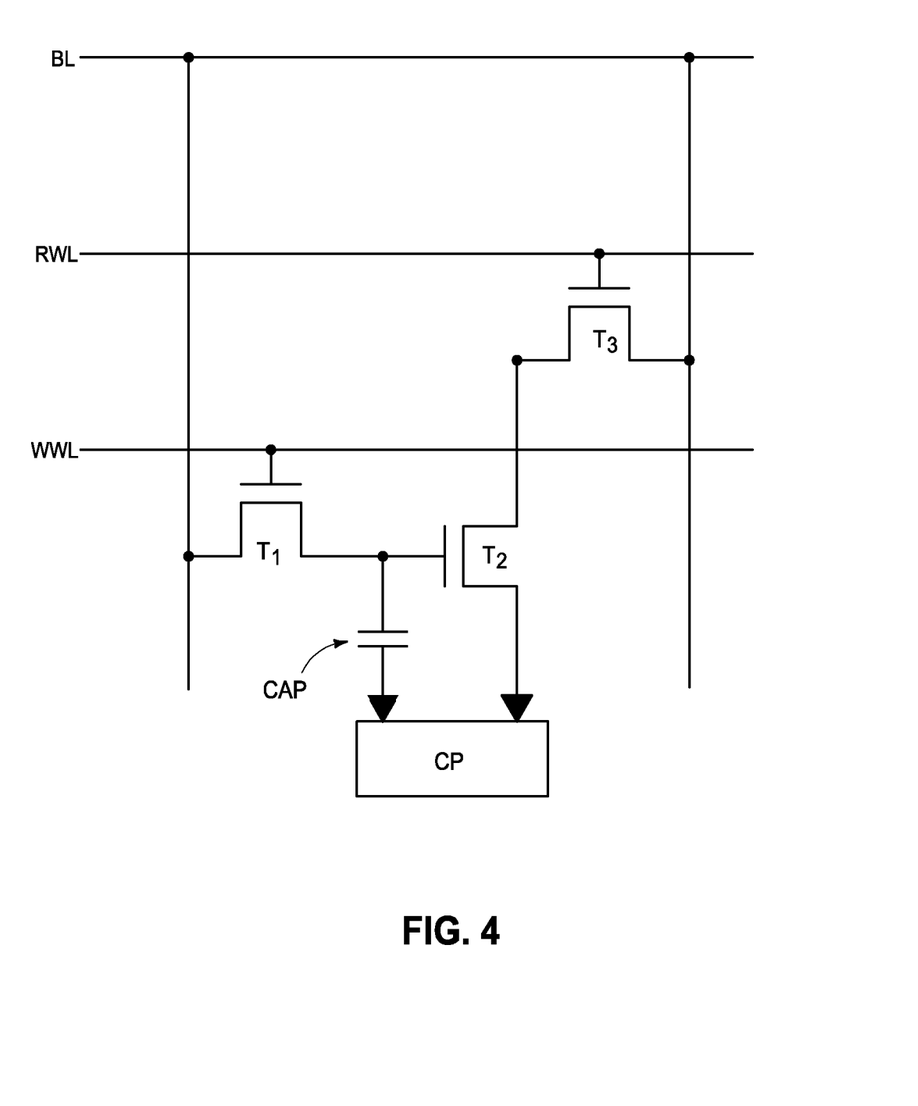
FIG. 4 is a schematic diagram of another example memory cell having 3 transistors and 1 capacitor.

FIG. 3 is a top view of a region of memory array 10 showing an example embodiment relationship between the write wordlines (WWL) and read wordlines (RWL), the write bitlines (WBL) and read bitlines (WBL), and the capacitors (CAP1 and CAP2). The cross-section of FIG. 2 is along the line 2-2 of FIG. 3. The write wordlines (WWL) are directly over the read wordlines (RWL) as shown in FIGS. 2 and 3, and the write bitlines (WBL) are directly over the read bitlines (WBL) as is also shown in FIGS. 2 and 3.

The schematic diagram of FIG. 1 shows a read bitline (RBL) separate from a write bitline (WBL). In some embodiments, the read and write bitlines may be electrically coupled together as a common bitline (BL), as shown in a schematic diagram of FIG. 4.

Figure 5:
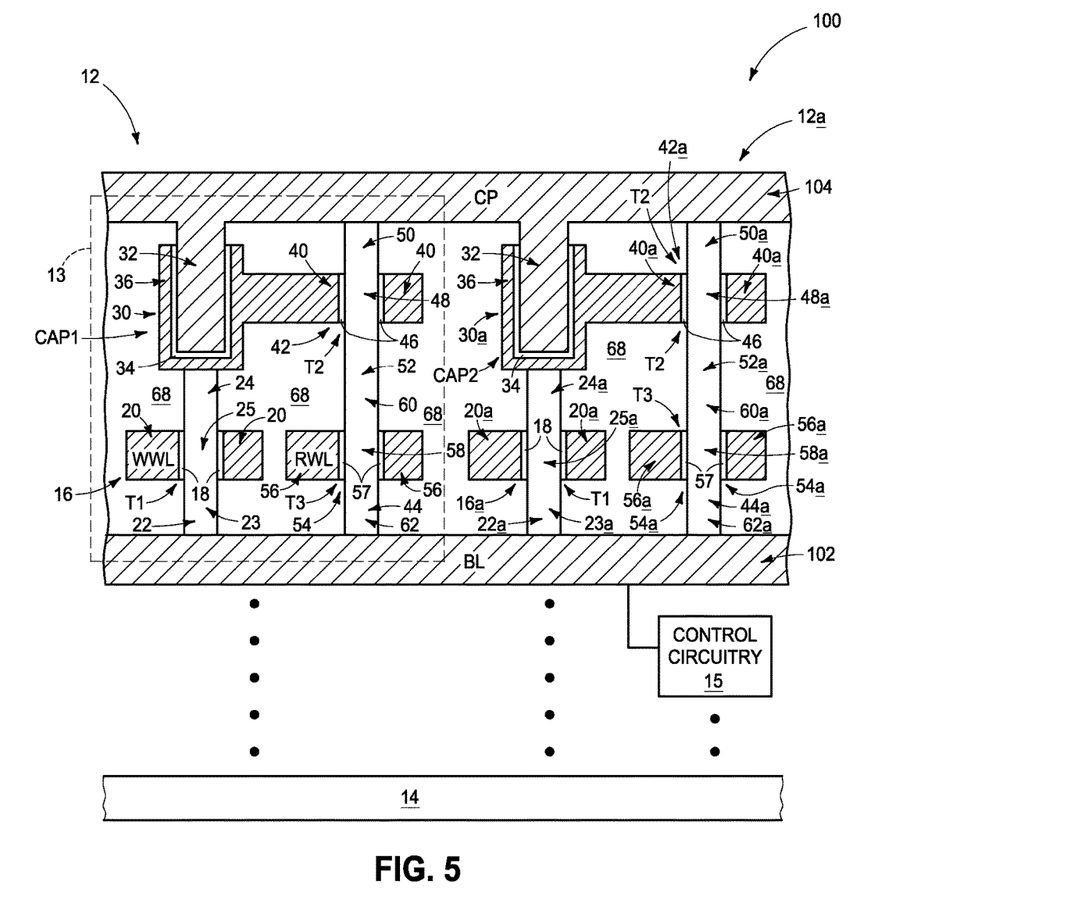
FIG. 5 is a diagrammatic cross-sectional side view of a region of a memory array showing another example configuration for memory cells having 3 transistors and 1 capacitor.

FIG. 5 shows a portion of an example embodiment memory array 100 illustrating an example arrangement of the components of 3T-1C memory cells in an embodiment in which a single bitline (BL) is utilized for both reading (i.e., sensing) and writing (i.e., accessing).

The illustrated portion of memory array 100 is supported by the base 14. Control circuitry 15 is also supported by base 14 and connects with the bitline (BL) 102.

A rail 104 (shown at a voltage of the common plate "CP") is over the bitline 102, and is spaced from the bitline. The rail may be a comprised by a plate, wire or other suitable structure, and may comprise any suitable electrically conductive composition or combination of compositions.

The rail 104 and bitline 102 may comprise a same composition as one another, or may comprise different compositions relative to one another.

The first transistors (T1) 16 and 16*a* are over the bitline 102. Such transistors include the gate dielectric material 18 and conductive gate materials 20 and 20*a*. The conductive gate materials 20 and 20*a* of the T1 transistors are comprised write wordlines (WWL) that extend in and out of the page relative to the cross-section of FIG. 5, with the label WWL being provided relative to the gate material 20 of memory cell 12.

Semiconductor pillars 22 and 22*a* extend from the bitline 102 and upwardly through T1 transistors 16 and 16*a*. The T1 transistor 16 comprises the first channel region 25, and the first and second conductively-doped source/drain regions 23 and 24. Similarly, the T1 transistor 16a comprises the first channel region 25a, and the first and second source/drain regions 23a and 24a.

The first source/drain regions 23 and 23a are electrically coupled with the bitline 102, and in the shown embodiment extend to directly contact the bitline.

The source/drain regions 24 and 24a extend to outer nodes 36 of capacitors 30 and 30a, respectively. The capacitors may be alternatively referred to as CAP1 and CAP2.

Each of the capacitors 30 and 30a has an inner node 32 and a capacitor dielectric material 34.

The inner nodes 32 are electrically coupled with the rail 104, and in the shown embodiment extend to the rail. Accordingly the inner nodes 32 are electrically coupled with the common plate "CP".

The outer nodes 36 extend to gates 40 and 40a of the second transistors (T2) 42 and 42a.

The outer nodes 36 and gates (40 and 40a) may comprise a single homogeneous electrically conductive material. In other embodiments, two or more electrically conductive materials may be utilized so that the outer nodes and gates may comprise different electrically conductive materials relative to one another.

Semiconductor pillars 44 and 44a extend through the gates 40 and 40a, with semiconductor material of pillars 44 and 44a being spaced from conductive material of gates 40 and 40a by gate dielectric material 46.

The T2 transistors 42 and 42a comprise the second channel regions 48 and 48a within semiconductor material of pillars 44 and 44a. Transistor 42 comprises the third and fourth source/drain regions 50 and 52 on opposing sides of channel region 48, and transistor 42a comprises the third and fourth source/drain regions 50a and 52a on opposing sides of channel region 48a.

The semiconductor pillars 44 and 44a extend downwardly through third transistors (i.e., T3 transistors) 54 and 54a.

The third transistors 54 and 54a have gates 56 and 56a connected to the read wordlines (RWL), with the label RWL being provided relative to the gate 54 of memory cell 12. Semiconductor material of pillars 44 and 44a is spaced from conductive material of gates 56 and 56a by gate dielectric material 57. The transistors 54 and 54a have third channel regions 58 and 58a within the semiconductive material of pillars 44 and 44a. Transistor 54 comprises fifth and sixth source/drain regions 60 and 62 on opposing sides of channel region 58, and transistor 54a comprises fifth and sixth source/drain regions 60a and 62a on opposing sides of channel region 58a. The fifth source/drain regions 60 and 60a of the T3 transistors overlap the fourth source/drain regions 52 and 52a of the T2 transistors within semiconductor pillars 44 and 44a; and in practice the fourth source/drain regions may be effectively identical and coextensive with the fifth source/drain regions. In other embodiments the fifth source/drain regions may be separated from the fourth source/drain regions and electrically coupled to the fourth source/drain regions through interconnects (not shown).

In the illustrated embodiment the semiconductor pillars 44 and 44a extend from the rail 104 to the bitline 102. The third source/drain regions 50 and 50a are electrically coupled with the rail 104, and the sixth source/drain regions 62 and 62a are electrically coupled with the bitline 102.

The Insulative material 68 is shown to surround the various components of memory cells 12 and 12a in the embodiment of FIG. 5.

The embodiment of FIG. 5 is similar to that of FIG. 2 in that the third transistors (T3) are vertically stacked under the second transistors (T2) along the pillars 44 and 44a. However, the embodiment of FIG. 5 differs from that of FIG. 2 in that the first transistors T1 are within a same horizontal plane as the third transistors T3 in the embodiment of FIG. 5, whereas all of the first, second third transistors (T1, T2 and T3) are vertically displaced from one another in the embodiment of FIG. 2.

Figure 6:
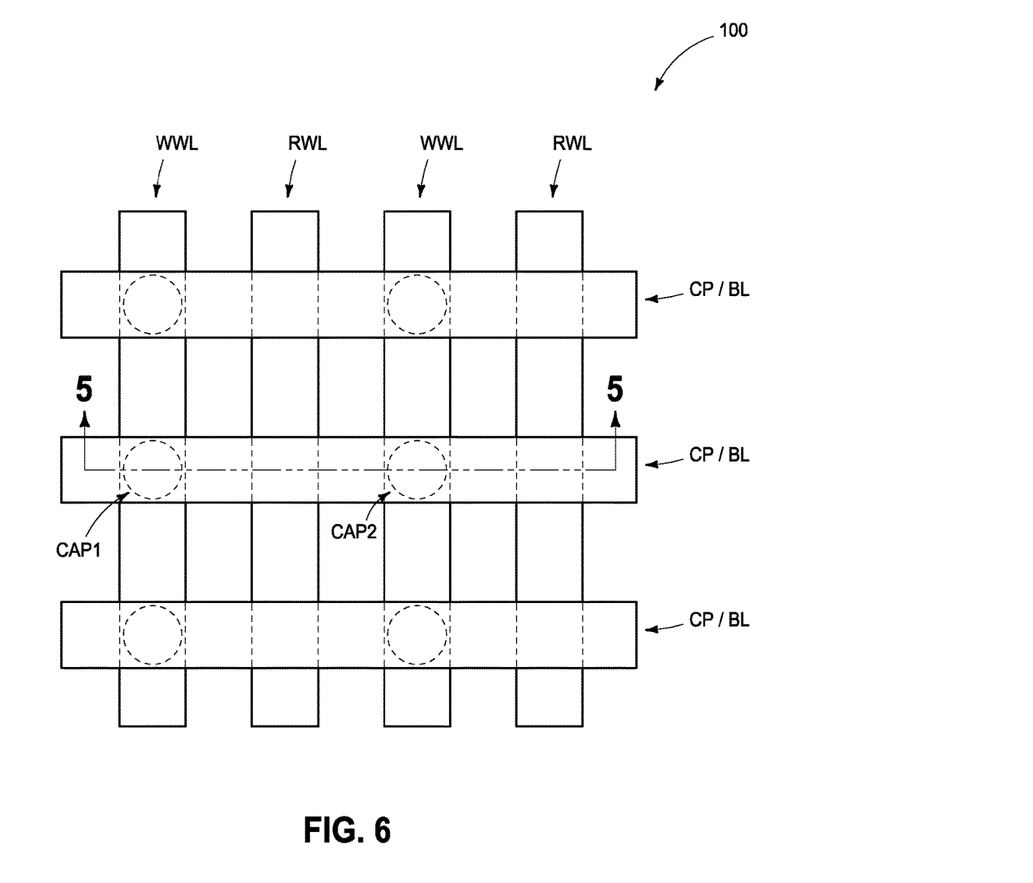
FIG. 6 is a diagrammatic top view of the memory array of FIG. 5.

FIG. 6 is a top view of a region of memory array 100 showing an example embodiment relationship between the write wordlines (WWL) and read wordlines (RWL), the bitlines (BL), the common plate rails (CP), and the capacitors (CAP1 and CAP2). The cross-section of FIG. 5 is along the line 5-5 of FIG. 6. The write wordlines (WWL) are horizontally displaced from the read wordlines (RWL) as shown in FIGS. 5 and 6, and the common plate rails (CP) are directly over the bitlines (BL) as shown in FIGS. 5 and 6.

Figure 7:
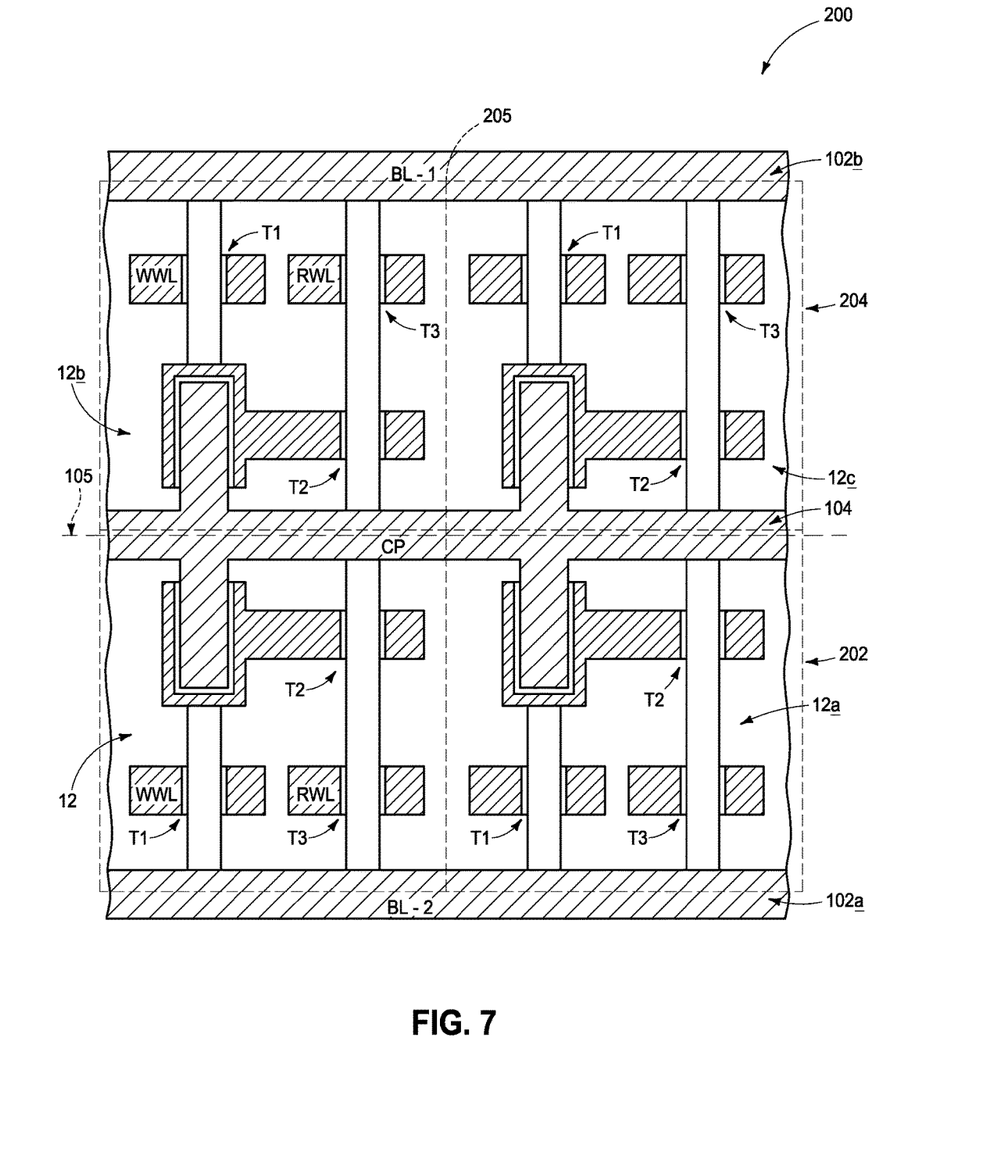
FIG. 7 is a diagrammatic cross-sectional side view of a memory array showing another example configuration for memory cells having 3 transistors and 1 capacitor.

The embodiment of FIGS. 5 and 6 may considered to show a first tier of memory cells in an array. In some embodiments a second tier may be formed over the first tier and inverted such that the common plate rail 104 may be shared between the tiers. FIG. 7 shows a region of a memory array 200 having a first tier 202 and a second tier 204 over the first tier.

The first tier 202 comprises memory cells 12 and 12a of the type described in FIGS. 5 and 6. The second tier 204 comprises similar memory cells 12b and 12c, except that the second memory cells are inverted relative to the first memory cells. Dashed lines 205 are provided to approximately demarcate boundaries of the memory cells.

In some embodiments the rail 104 may be considered to extend along a mirror plane 105. The memory cells 12b and 12c may be considered to be substantially mirror images of the memory cells 12 and 12a, respectively, across the mirror plane. The term "substantially mirror images" is utilized to indicate that the indicated cells may be mirror images of one another to within reasonable tolerances of fabrication and measurement.

In some embodiments the configuration of FIGS. 5 and 6 may be considered to comprise memory cells within $4F^2$ architecture, and the configuration of FIG. 7 may be considered to comprise memory cells within $8F^2$ architecture.

The illustrated capacitors in the above-described embodiments may be replaced with other capacitive units in other embodiments. For instance, any of the capacitors may be replaced with a capacitive unit having two or more capacitors in combination.

Figure 8:
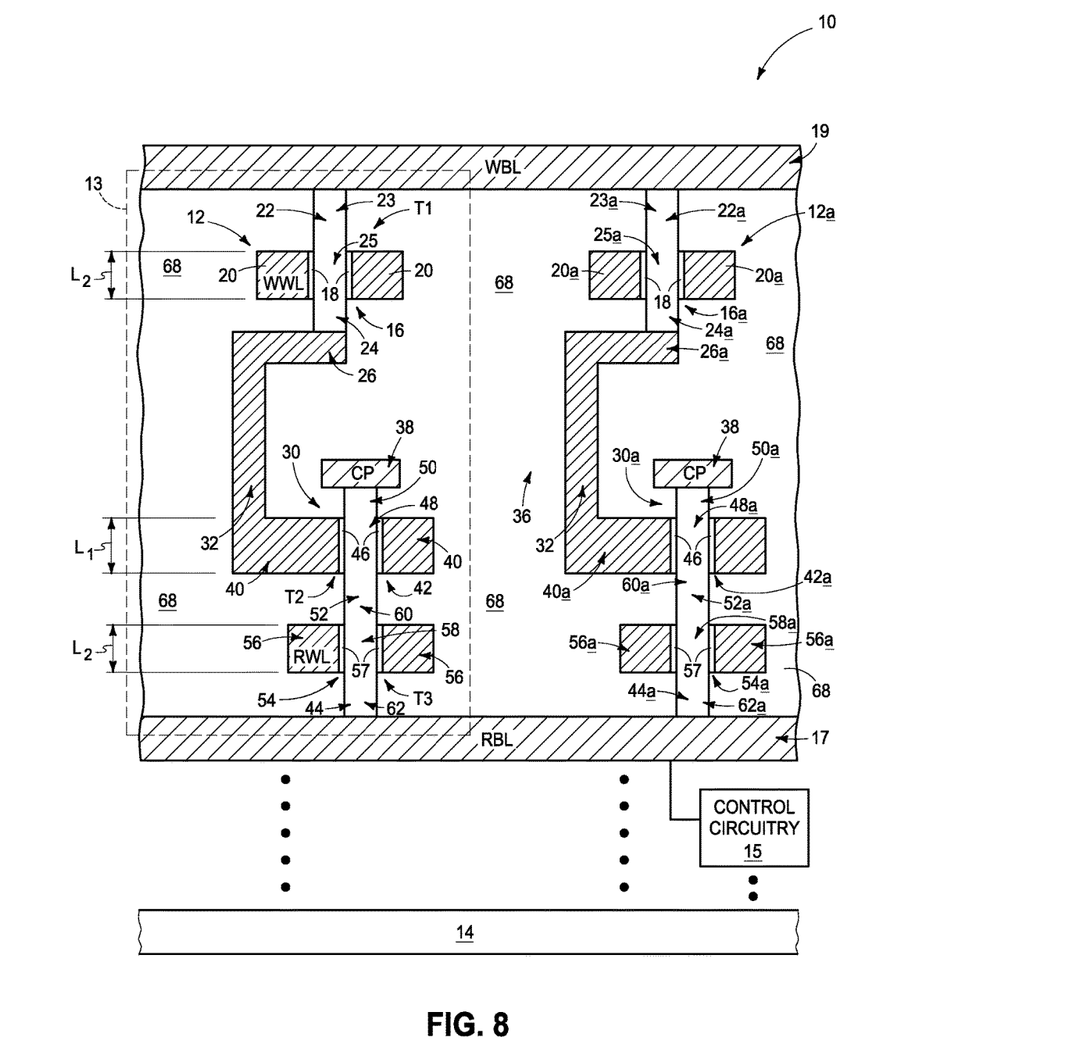
FIGS. 8 and 9 are diagrammatic cross-sectional side views of regions of memory arrays showing additional example configurations for memory cells.
Figure 9:
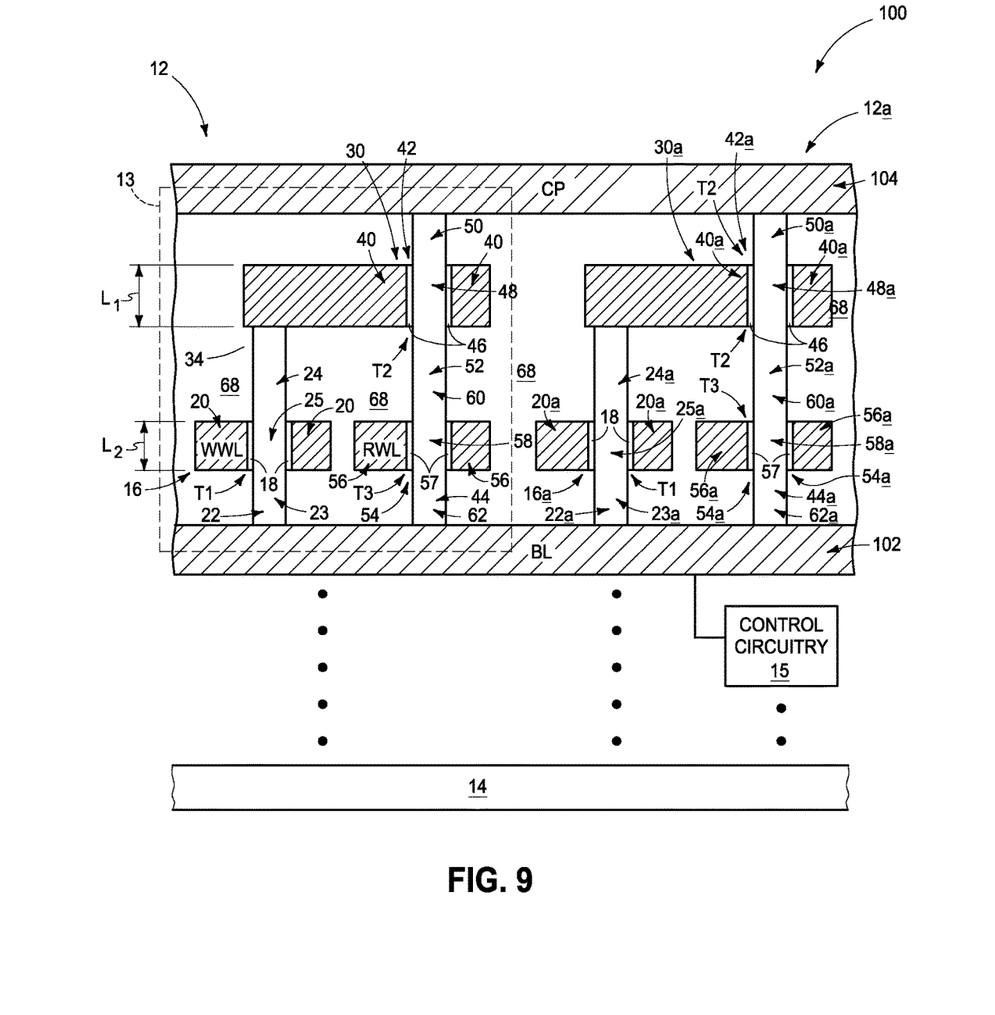

In some embodiments the capacitors of the above-described embodiments may comprise the gate dielectric material of the T2 transistors, and may correspond to capacitive properties associated with such gate dielectric material during operation of the transistors. In other words, the second transistors T2 may function as the capacitors if the second transistors T2 have enough gate capacitance. For instance, the capacitive structures 30 and 30a of FIG. 2 may be replaced by capacitive properties of the T2 transistors as shown in an alternative embodiment of FIG. 8. As another example, the capacitive structures 30 and 30a of FIG. 5 may be replaced by capacitive properties of the T2 transistors as shown in an alternative embodiment of FIG. 9. In the embodiments of FIGS. 8 and 9, the channel regions of the second transistors T2 (channel regions 48 and 48a) are larger in length than the channel regions of the first transistors T1 (channel regions 25 and 25a) and the third transistors T3 (channel regions 58 and 58a) in order to achieve adequate gate capacitance. In the embodiments of FIGS. 8 and 9, the channel regions of T2 are shown having lengths $L_1$, and the channel regions of TI and T3 are shown having lengths L2, with L2 being less than $L_1$.

In some embodiments, memory cells of the type shown in FIG. 9 may incorporated into an array analogous to that described above with reference to FIG. 7.

The transistors T1, T2 and T3 of the above-described embodiments of FIGS. 2-9 may comprise any suitable configurations. For instance, in the illustrated embodiments the transistors are field effect transistors, but in other embodiments other suitable transistors may be substituted for one or more of the transistors T1, T2 and T3; with bipolar junction transistors being an example of a transistor configuration which may be used alternatively to field effect transistors. The field effect transistors described herein may utilize gate dielectric comprising non-ferroelectric material and/or ferroelectric material depending on the application. The gates of the transistors may have any of numerous configurations, with some example configurations be described with reference to FIGS. 10-14. The figures specifically pertain to the T3 transistor gates, but in other embodiments analogous configurations may be utilized for the T1 and/or T2 transistor gates.

Figure 10:
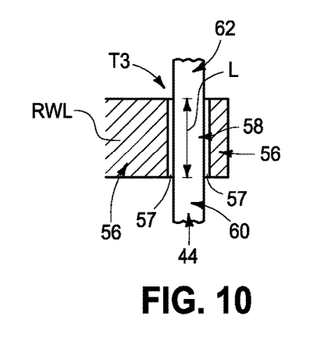
FIGS. 10-14 are expanded regions of one of the transistors of FIGS. 2, 5 and 7-9 showing example embodiment configurations of such transistor.
Figure 11:
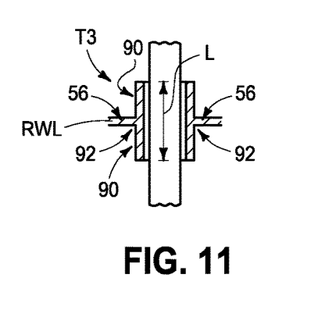
Figure 12:
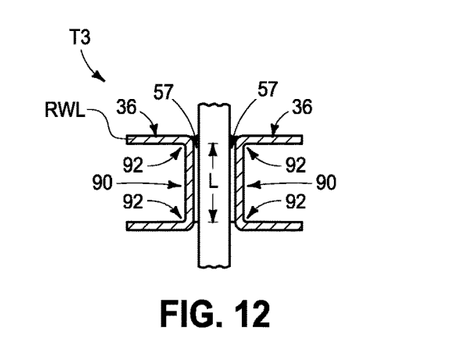
Figure 13:
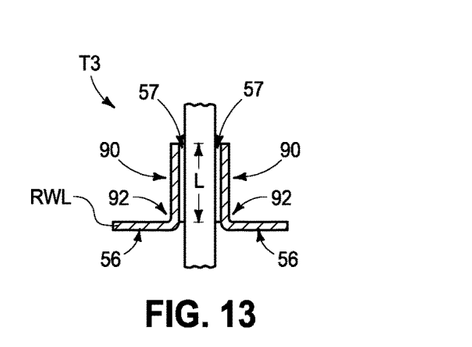
Figure 14:
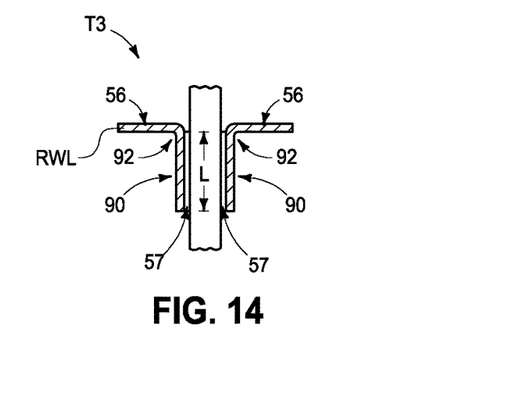

Referring to FIG. 10, a T3 transistor gate 56 is shown in a configuration of the type utilized in the embodiments of FIGS. 2, 5 and 7-9. Specifically, the transistor gate 56 is a block of uniform width, with such width being approximately equal to a length "L" of the channel region 58. In contrast, each of the embodiments of FIGS. 11-14 has the gate narrower than the length of the channel region, and has at least one extension region 90 that extends from the gate and along the channel region. Further, each of the embodiments of FIGS. 11-14 has at least one bent region 92 where the gate 56 joins to an extension region. The embodiment of FIG. 11 shows the gate 56 and extension regions 90 forming a substantially T-shaped configuration, the embodiment of FIG. 12 shows the extension region 90 and gate 56 together forming a substantially U-shaped configuration, and the embodiments of FIGS. 13 and 14 show the gate 56 and extension regions 90 forming substantially shelf-shaped configurations (with FIG. 14 showing the gate 56 as a top shelf over extension regions 90 and FIG. 13 showing the gate 56 as a bottom shelf beneath regions 90).

Advantages of the embodiments of FIGS. 11-14 relative to that of FIG. 10 may include reduced gate resistance and associated reduced current requirements for desired access drive parameters.

The structures and architectures described above may be incorporated into memory (e.g., DRAM, SRAM, etc.) and/or otherwise may be utilized in electronic systems. Such electronic systems may be any of a broad range of systems, such as, for example, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

Both of the terms "dielectric" and "electrically insulative" may be utilized to describe materials having insulative electrical properties, including a space or an air gap. The terms are considered synonymous in this disclosure. The utilization of the term "dielectric" in some instances, and the term "electrically insulative" in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Some embodiments include a memory cell having first, second and third transistors, with the second and third transistors being vertically displaced relative to one another. The memory cell has a semiconductor pillar extending along the second and third transistors, with the semiconductor pillar comprising channel regions and source/drain regions of the second and third transistors.

Some embodiments include a memory cell comprising a write bitline, and a first transistor under the write bitline. The first transistor includes a first channel region between first and second source/drain regions. The first source/drain region is electrically coupled with the write bitline. The first transistor has a first transistor gate along the first channel region. A capacitor is under the first transistor. The capacitor has an inner node, an outer node, and a capacitor dielectric material between the inner and outer nodes. The second source/drain region is electrically coupled with the inner node. A second transistor has a second transistor gate electrically coupled with the inner node and has a second channel region. A third transistor is under the second transistor and has a third transistor gate along a third channel region. A semiconductor pillar extends along the second and third gates. The second and third channel regions are within semiconductor material of the semiconductor pillar. A read bitline is under the third transistor and directly against the semiconductor pillar.

Some embodiments include a memory cell having a rail at a common plate voltage. A capacitor is under the rail. The capacitor has an inner node, an outer node, and a capacitor dielectric material between the inner and outer nodes. The inner node is electrically coupled with the rail. A first transistor is under the capacitor and comprises a first channel region between first and second source/drain regions. A bitline is under the first transistor. The first source/drain region is electrically coupled with the bitline and the second source/drain region is electrically coupled with the outer node. A second transistor has a second transistor gate electrically coupled with the outer node. The second transistor includes a second channel region between third and fourth source/drain regions. A third transistor is under the second transistor. The third transistor includes a third channel region between fifth and sixth source/drain regions. A semiconductor pillar extends along the second and third gates. The second and third channel regions are within semiconductor material of the semiconductor pillar. The third, fourth, fifth and sixth source/drain regions are within the semiconductor material of the semiconductor pillar. The semiconductor pillar is against the bitline, and the sixth source/drain region is electrically coupled with the bitline.

Some embodiments includes an apparatus comprising a semiconductor base, a plurality of memory cells, and an insulating film intervening between the semiconductor base and the plurality of memory cells. Each of the plurality of memory cells comprises first and second transistors. The first transistor includes first and second source/drain regions, a first channel region therebetween and a first gate controlling the first channel region, and the first gate is electrically connected to a first wordline. The first and second source/drain regions and the first channel region are vertically disposed with one another. The second transistor including third and fourth source/drain regions, a second channel region therebetween and a second gate controlling the second channel region. The third and fourth source/drain regions and the second channel region being vertically disposed with one another between a first bitline and a common plate, and the second gate is electrically coupled to the second source/drain region of the first transistor.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A memory cell comprising:
   a three-transistor-one-capacitor (3T-1C) configuration; the three transistors of the 3T-1C configuration being a first transistor, a second transistor and a third transistor; the second and third transistors being vertically displaced relative to one another;
   a semiconductor pillar extending along the second and third transistors and comprising channel regions and source/drain regions of the second and third transistors;
   the capacitor of the 3T-1C configuration having an inner node, an outer node, and a dielectric material between the inner and outer nodes; the outer node being electrically coupled with a source/drain region of the first transistor and with a gate of the second transistor; and
   wherein the first transistor is between the capacitor and a bitline, wherein the inner node of the capacitor is electrically coupled with an electrically conductive structure at a common plate voltage, and wherein the semiconductor pillar has an end against said electrically conductive structure.

2. A memory array, comprising:
   an electrically conductive rail at a common plate voltage, with the rail extending along a mirror plane;
   a bitline vertically spaced from the conductive rail;
   a first memory cell which includes:
      a capacitor under the electrically conductive rail; the capacitor having an inner node, an outer node, and a capacitor dielectric material between the inner and outer nodes; the inner node being electrically coupled with the electrically conductive rail;
      a first transistor under the capacitor and comprising a first channel region between first and second source/drain regions;
      the first transistor being over the bitline; the first source/drain region being electrically coupled with the bitline, and the second source/drain region being electrically coupled with the outer node;
      a second transistor having a second transistor gate electrically coupled with the outer node; the second transistor comprising a second channel region between third and fourth source/drain regions;
      a third transistor under the second transistor; the third transistor comprising a third channel region between fifth and sixth source/drain regions;
      a semiconductor pillar extending along the second and third gates; the second and third channel regions being within semiconductor material of the semiconductor pillar; the third, fourth, fifth and sixth source/drain regions being within the semiconductor material of the semiconductor pillar; and
      the semiconductor pillar being against the bitline, the sixth source/drain region being electrically coupled with the bitline; and
   a second memory cell on an opposing side of the electrically conductive rail from the first memory cell, with the second memory cell being substantially a mirror image of the first memory cell across the mirror plane; the second memory cell sharing the electrically conductive rail with the first memory cell.

3. The memory cell of claim 2 wherein a gate of the third transistor is configured to have at least one bent region, and one or more extension regions that extend along the third channel region from said at least one bent region; and wherein the gate of the third transistor and the one or more extension regions together form a substantially T-shaped configuration, substantially shelf-shaped configuration or substantially U-shaped configuration.

* * * * *

UNITED STATES PATENT AND TRADEMARK OFFICE
CERTIFICATE OF CORRECTION

| | |
|---|---|
| PATENT NO. | : 10,361,204 B2 |
| APPLICATION NO. | : 16/006301 |
| DATED | : July 23, 2019 |
| INVENTOR(S) | : Suraj J. Mathew et al. |

It is certified that error appears in the above-identified patent and that said Letters Patent is hereby corrected as shown below:

(72) Inventors – Replace "Fatma Arzum Slmsek-Ege"
With --Fatma Arzum Simsek-Ege--

Signed and Sealed this
Twelfth Day of November, 2019

Andrei Iancu
*Director of the United States Patent and Trademark Office*